United States Patent [19]

Antypas et al.

[11] 4,400,868
[45] Aug. 30, 1983

[54] METHOD OF MAKING A TRANSPARENT AND ELECTRICALLY CONDUCTIVE BOND

[75] Inventors: George A. Antypas, Los Altos; Ronald L. Bell, Woodside; Ronald L. Moon, Atherton, all of Calif.

[73] Assignee: Varian Associates, Inc., Palo Alto, Calif.

[21] Appl. No.: 351,707

[22] Filed: Feb. 24, 1982

Related U.S. Application Data

[62] Division of Ser. No. 221,100, Dec. 29, 1980, Pat. No. 4,338,480.

[51] Int. Cl.³ .................. H01L 21/283; H01L 31/04
[52] U.S. Cl. .................................. 29/572; 29/576 J; 29/591; 136/249; 357/30; 357/77
[58] Field of Search .............. 29/572, 576 J, 589, 29/591; 136/249 TJ; 357/30 J, 65, 68, 77; 228/121, 123, 165

[56] References Cited

U.S. PATENT DOCUMENTS 4,045,594  8/1977  Maddocks ................ 29/591 X
4,255,211  3/1981  Fraas ........................ 357/30 X

OTHER PUBLICATIONS

Vander Plas, H. A. et al., "Final Report by Varian Associates, Inc. on Sandia Contract No. D7-69-53A," Chapters VII and VIII, May 1980.

Primary Examiner—L. Dewayne Rutledge
Assistant Examiner—Alan E. Schiavelli
Attorney, Agent, or Firm—Stanley Z. Cole; Keiichi Nishimura

[57] ABSTRACT

Solar cells with different bandgaps are stacked to form a multijunction photovoltaic converter with a high conversion efficiency. By stacking the cells mechanically rather than by growing them all at one time, the most convenient combination of materials may be selected for the cells. The stacking is completed by means of a glass sealing layer with moats containing inter-cell contacts which are bonded to the cells.

8 Claims, 3 Drawing Figures

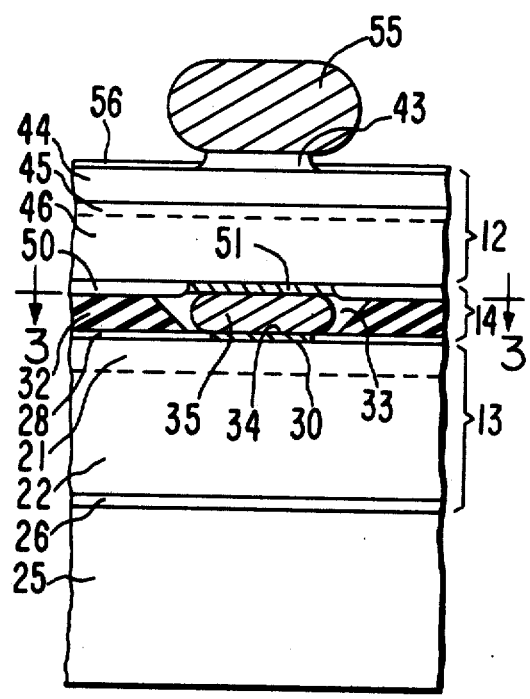
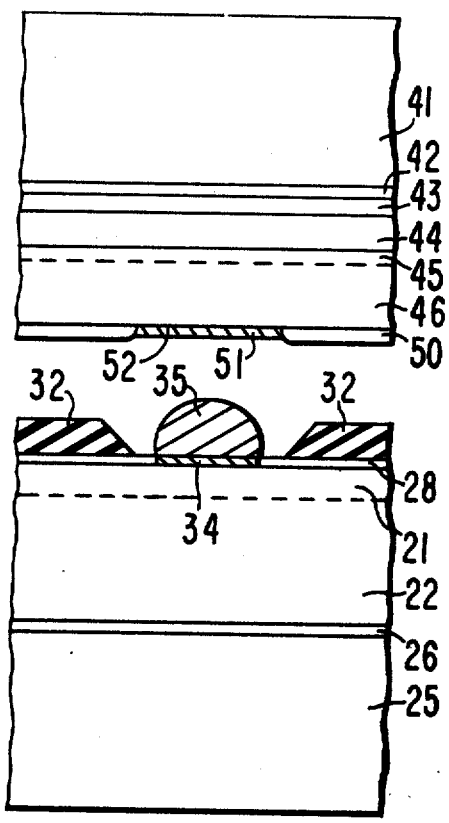
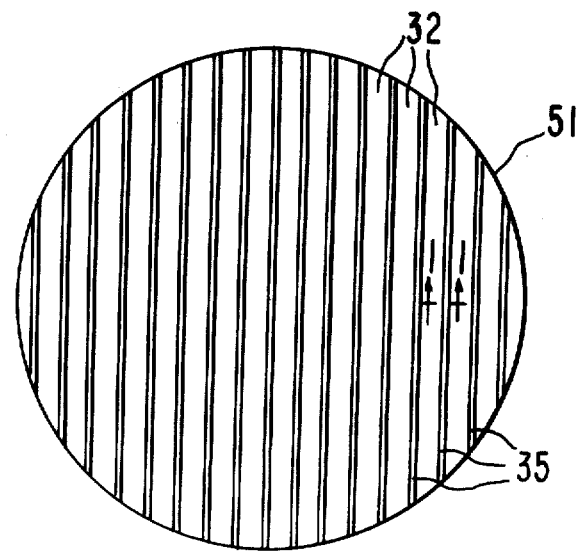

METHOD OF MAKING A TRANSPARENT AND ELECTRICALLY CONDUCTIVE BOND

This application is a division of application Ser. No. 221,100, filed Dec. 29, 1980 now U.S. Pat. No. 4,338,480.

DESCRIPTION

FIELD OF THE INVENTION

This invention relates to stacked multijunction photovoltaic converters with improved energy conversion and series resistance characteristics and method of fabrication thereof, and it relates more particularly to such stacked multijunction photovoltaic converters with solar cells mechanically attached by glass sealing.

BACKGROUND OF THE INVENTION

It has long been the objective of many inventions to produce electrical power inexpensively from solar electromagnetic radiation. Recently, there have been attempts to obtain very high energy conversion efficiencies by means of so-called multijunction photovoltaic converters, or by stacking solar cells with different bandgaps. Conversion efficiencies of the order of 32% for two junctions, 36% for three junctions and 38% for four junctions have been projected. Among the examples of such multijunction cells are epitaxially stacked monolithic AlGaAs/GaAs/Ge dual junction cells and monolithic CdZnS/InGaP/GaInAs/Ge 3-junction cells described in an article entitled "Design of High Efficiency Monolithic Stacked Multijunction Solar Cells" by L. M. Fraas and R. C. Knechtli, Proc. of the 13th IEEE Photovoltaic Spec. Conf., 1978. Such solar cells that are monolithically stacked on a single wafer are naturally cheaper, simpler and more easily cooled than a multiple wafer stack.

More recently, however, attempts have been made to stack upper and lower bandgap cells by attaching them mechanically rather than by growing them sequentially. The advantage of this method as disclosed in the Final Report dated May, 1980 by the instant assignee on Sandia Contract No. 07-6953A (pg. 34, et seq) resides in the flexibility with which the most convenient combination of materials may be selected for the cells so as to increase the chances of obtaining the high conversion efficiencies that are theoretically predicted. Such freedom of choice is also expected to contribute to the conservation of critical materials such as gallium.

Inherent in the stacking of solar cells to form an efficient photovoltaic converter, however, is the problem of making a void-free, transparent filler for thermal conduction as well as ohmic contacts with low series resistance. Use of glass as a support pad for a solar cell has been disclosed, for example, in U.S. Pat. No. 4,108,704 issued to William E. Horne, but the problem of internal electrical connection of the cells still remains.

SUMMARY OF THE INVENTION

It is an object of this invention to provide a bond which is electrically and thermally conductive and electromagnetically transparent, and to provide a method of making it.

It is another object of this invention to provide a stacked photovoltaic converter.

It is still another object of this invention to provide a stacked photovoltaic converter which has a high conversion efficiency.

It is a still further object of this invention to provide a method of making a stacked photovoltaic converter with improved electrical and thermal conductivity characteristics.

BRIEF DESCRIPTION OF THE DRAWINGS

FIG. 1 is a cross-sectional view of a section of a stacked dual junction photovoltaic converter embodying the present invention, said view of a section being taken, for example, along line 1—1 in FIG. 3.

FIG. 2 is a cross-sectional view of a section of structures at an earlier stage before they are stacked together to form the converter a section of which is shown in FIG. 1.

FIG. 3 is a plan view of the converter of FIG. 1 taken at the position of line 3—3 in FIG. 1, showing an example of the pattern according to which the moats in the glass layer are laid.

DETAILED DESCRIPTION OF THE INVENTION

FIG. 1 shows a stacked two-junction photovoltaic converter 10 embodying the present invention. Described in a most rudimentary form, it consists of an AlGaAs cell 12 stacked on top of a silicon cell 13 with a sealing layer 14 in between. The choice of these two types of solar cells to be stacked together was made in view of the earlier calculations and experiments which showed that the bandgap combination 1.1 ev/1.65 ev is nearly optimum for AM2 conversion, especially at temperatures above room temperature, and of the knowledge that these bandgaps are available with silicon and AlGaAs, respectively.

FIG. 2 shows these two solar cells more in detail and at an earlier stage, i.e., when they are ready to be joined together but have not yet been brought into contact. Silicon cell 13 is of the usual structure with a junction plane (shown by a dotted line) separating a $p^+$-type silicon layer 21 and an n-type silicon layer 22. A heat sink 25 which may be of a metal or of a ceramic material such as $Al_2O_3$ is attached on the n-type layer 22 in order to keep the cell cool. The heat sink is shown both in FIGS. 1 and 2 as being attached through a back contact metallization layer or layers 26. Any known method of solder attachment can be used for this purpose.

The top surface of the silicon cell 13 is covered by a dielectric layer 28. This can be either of silicon dioxide or of silicon nitride placed on the $p^+$-type silicon layer 21 by a chemical vapor deposition method. As shown in FIGS. 1 and 2, the dielectric layer 28 does not cover the top surface of the silicon cell 13 completely. A predetermined pattern is described on the top surface of silicon cell 13 so that there are certain areas 30 on the top surface of the $p^+$-type silicon layer 21 which remain exposed, that is, not covered by the dielectric layer 28.

Deposited further on the dielectric layer 28 is a glass layer 32 of thickness about 3 microns. Moats 33 are provided in the glass layer 32 so that the exposed areas 30 on the top surface of the $p^+$-type silicon layer 21 will remain exposed.

Electrical contact between the AlGaAs cell 12 and the silicon cell 13 is achieved through intercell contacts 35. For this purpose, a contact metallization pattern 34, for example, of AuMg alloy is applied by the usual method known in the art including the steps of evaporation, photoresist lifting and annealing. It is then plated with gold or silver to form a mushroom cross section which, as shown in FIG. 2, protrudes higher than the sealing glass 32.

The AlGaAs cell 12 is grown on a GaAs substrate 41 by a known method in the art in order with an AlGaAs stop layer 42, a p+-type GaAs contact layer 43, a p+-type high bandgap AlGaAs window layer 44, a p+-type lower bandgap AlGaAs active layer 45 and an n-type AlGaAs active layer 46. The p-n junction between the p+- and n-type active layers 45 and 46 is also shown by a dotted line in FIGS. 1 and 2.

Before the AlGaAs cell 12 and the silicon cell 13 thus prepared are sealed together, an anti-reflective coating 50, for example, of silicon dioxide or silicon nitride is placed on the bottom surface of the AlGaAs cell 12. Certain areas 52 on the bottom surface of the AlGaAs cell 12 are left uncoated, however, for the purpose of electrical contact with the silicon cell 13 by way of the inter-cell contacts 35. Thus, such uncovered areas 52 on the AlGaAs cell 12 should describe a pattern which matches the contact metallization pattern 34 on the silicon cell 13.

Another metallization layer 51 is deposited on the uncovered areas 52 on the AlGaAs cell 12 in the same way the lower contact metallization layer 34 was deposited on the silicon cell 13. If direct metallization of the AlGaAs proves to be unreliable, an additional GaAs n+ GaAs contact layer (not shown) can be added in the growth, and extra processing steps added. The thickness of the metallization layer 51 may be increased slightly by plating with gold.

The two structures of FIG. 2 are then aligned on a heated stage under an infrared microscope. The alignment of the contact metallization pattern 34 on the silicon cell 13 with the other metallization layer 51 on the AlGaAs cell 12 can be effected automatically by minimizing infrared transmission through the assembly before bonding. This method is possible because GaAs is transparent to infrared.

The two mating surfaces of FIG. 2 to be bonded together must be flat to within about 1 micron. Thus, the silicon and GaAs substrate wafers must be polished flat to lithographic standards. If the AlGaAs cell 12 is grown by liquid phase epitaxy, it may be necessary to repolish its surface after growth.

After the two structures are properly aligned, they are clamped together. The sealing temperature depends on the softening point of the sealing glass 32. At a sufficiently high temperature, the inter-cell contact 35 will deform to form a compression bond, and the anti-reflective layer 50 on the AlGaAs will seal to the glass layer 32. The temperature is raised to above 300° C. to form a gold-to-gold compression bond.

Since the mushroom-shaped inter-cell contact 35 originally protrudes higher than the sealing glass 32, as mentioned before and shown in FIG. 2, it becomes squashed by the clamping. Thus, the moats 33 in the sealing glass layer 32 must be sufficiently wide in order to accommodate this spreading of the deformed inter-cell contact 35.

The exposed areas 30, and hence the contact metallization pattern 34 as well as the moats 33, may describe any pattern as long as the total area of contact between the two cells 12 and 13 is both sufficiently large to provide adequate electrical conduction therebetween and at the same time sufficiently small so that the sealing layer, taken as a whole, will remain reasonably transparent in spite of the presence of the inter-cell contacts 35. For the same reason, the spacing of the inter-cell contacts 35 must be determined in view of the "spreading resistance" of the adjacent layers, i.e., the n-type AlGaAs layer 46 and the p+-type silicon layer 21.

FIG. 3 is a view along the line 3—3 of FIG. 1 and purports to show an example of routing pattern of the moats 35. Edge 51 is circular in this example, corresponding to a circular disc-type converter, and moats 35 describe an array of evenly spaced parallel lines. It is preferable that the moats extend clear to the edge in order to avoid trapping of gases in the moats when the two cells 12 and 13 are sealed together. Since the cell current flow is vertical in FIG. 1 (not radial in FIG. 3), the inter-cell contacts can have a small cross section.

After the two structures of FIG. 2 are joined together, the GaAs substrate 41 is removed chemically by $NH_4OH-H_2O_2$ solution and the AlGaAs stop layer 42 is removed by $HF-H_2O$ solution to expose the p+-type GaAs contact layer 43 onto which top contacts 55 of AuMg are bonded in such a way that the areas of contacts will again align with the contact pattern of FIG. 3 in order to reduce the degree of obscuration. The GaAs contact layer 43 is further removed except where it is attached to the top contacts 55 as shown in FIG. 1 to expose the AlGaAs window layer 44. Another anti-reflective coating 56 which may for example consist of silicon oxide or silicon nitride is applied as shown to encapsulate the AlGaAs cell 12. Since the AlGaAs cell 12 consists mainly of aluminum and arsenic with comparatively little gallium, and since gallium can further be recovered from the etching processes for removing the substrate 41 and the top layer 42, the consumption of gallium is low.

The final assembly (FIG. 1) consists of an AlGaAs cell 12 of thickness typically less than 10 microns which is sealed to a relatively thicker silicon wafer 13. Thermal expansion coefficients are 6.48 for AlGaAs, 2.56 silicon and 14.2 for gold in units of $10^{-6}/°C$. As a result, the top cell 12 will be subject to a practically uniform strain upon cooling from the sealing temperature as well as a periodic strain from the inter-cell contacts of gold. These strains tend to cause minor anisotropic bandgap shifts and a reduction in mobility, and possibly lead to cracking. This, however, may not be serious because cracks parallel to the main direction of carrier diffusion represent only a minor perturbation on the cell operation so long as the penetration of corrosive agents can be prevented by the encapsulant.

Although the present invention has been shown in connection with a specific embodiment, the above description is to be considered as illustrative rather than limiting. For example, it is to be appreciated that devices with three or more junctions can be fabricated by straightforward extension of the method described above for a two-junction version. The types of solar cells to be stacked are not limited to AlGaAs and silicon cells. These cells are not required to be circular discs, nor is the inter-cell contact pattern required to consist of parallel straight lines as shown in FIG. 3. In sum, this invention is to be broadly construed, and is limited only by the following claims.

We claim:

1. A method of making an electrically conductive and electomagnetically transparent bond between two surfaces of solar cells which are stacked together to form a multijunction photovoltaic converter, said method comprising the steps of:

placing a glass layer over a portion of a first surface leaving certain areas thereof uncovered by said glass layer, depositing a metallizing layer on said certain areas on said first surface, bonding an electrically conductive contact on said metallizing layer, and bonding a second surface both to said contact and to said glass layer.

2. The method of claim 1 wherein said certain areas extend to the edges of said two surfaces.

3. The method of claim 1 wherein said contact protrudes higher than said glass layer prior to said step of bonding said second surface.

4. The method of claim 1 further comprising the step of depositing a dielectric layer on said first surface prior to said step of placing a glass layer.

5. The method of claim 1 further comprising the step of depositing an anti-reflective layer on said second surface prior to said step of bonding said second surface.

6. The method of claim 1 wherein said contact is gold.

7. The method of claim 1 wherein said step of bonding a second surface takes place at a temperature higher than 300° C.

8. The method of claim 1 wherein said step of bonding said second surface includes the step of depositing a second metallizing layer on a portion of said second surface.

* * * * *